United States Patent [19]
Armstrong

[11] Patent Number: 4,653,636
[45] Date of Patent: Mar. 31, 1987

[54] WAFER CARRIER AND METHOD

[75] Inventor: Richard J. Armstrong, Phoenix, Ariz.

[73] Assignee: Microglass, Inc., Syracruse, N.Y.

[21] Appl. No.: 734,471

[22] Filed: May 14, 1985

[51] Int. Cl.⁴ .................. B05C 13/02; B65D 25/02
[52] U.S. Cl. ................................. 206/334; 118/500;
206/454; 211/41; 432/259
[58] Field of Search ............. 118/500; 206/334, 454,
206/444, 445; 211/40, 41; 414/405; 432/253,
258, 259, 261

[56] References Cited

U.S. PATENT DOCUMENTS

| | | | |
|---|---|---|---|
| 3,889,815 | 6/1975 | Merle | 206/454 |
| 3,998,333 | 12/1976 | Kamada | 432/258 |
| 4,176,751 | 12/1979 | Gillissie | 220/22.3 |
| 4,244,673 | 1/1981 | Henderson | 414/405 |
| 4,256,229 | 3/1981 | Lee | 211/41 |
| 4,287,851 | 9/1981 | Dozier | 118/500 |
| 4,355,974 | 10/1982 | Lee | 432/253 |
| 4,461,386 | 7/1984 | Turner et al. | 118/500 |
| 4,548,159 | 10/1985 | Foster et al. | 118/500 |

FOREIGN PATENT DOCUMENTS

| | | | |
|---|---|---|---|
| 2248764 | 5/1975 | France | 118/500 |
| 0028197 | 10/1911 | United Kingdom | 432/259 |

OTHER PUBLICATIONS

"Diffusion Boat", Defries, *IBM Technical Disclosure Bulletin*, vol. 11, No. 12, May 1969.

Primary Examiner—William Price
Assistant Examiner—Jimmy G. Foster
Attorney, Agent, or Firm—Cahill, Sutton & Thomas

[57] ABSTRACT

A quartz wafer boat or carrier includes three slotted parallel members, each member including a plurality of grooves aligned with corresponding slots in the other members, for carrying semiconductor wavers in precise spaced parallel relationship to each other. The bottom member is located in substantially offset relationship to the center of gravity of the supported wafers. A first side member is located in substantial offset relationship to the opposite side of the center of gravity, so that the bottom member and the first side member completely support the wafers. A third side member is located on the same side of the center of gravity of the wafers as the bottom member, but normally does not support the wafers, but retains them if the wafer boat is accidentally tilted. The slots in the second side member are deep enough to prevent the edges of the supported wafers from contacting the bottoms of those slots as a result of thermal expansion of the supported wafers, to avoid binding and stressing thereof.

17 Claims, 10 Drawing Figures

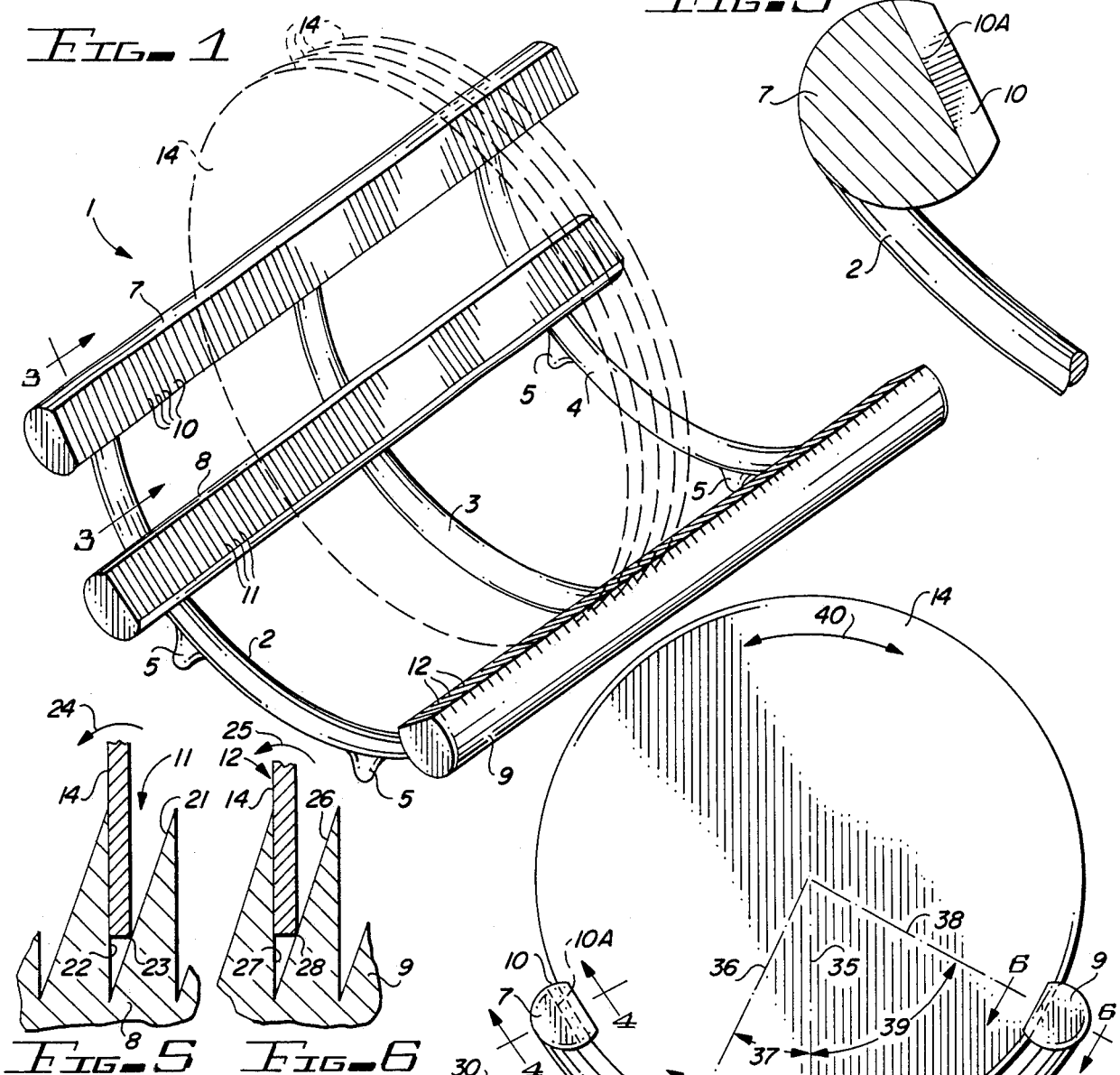
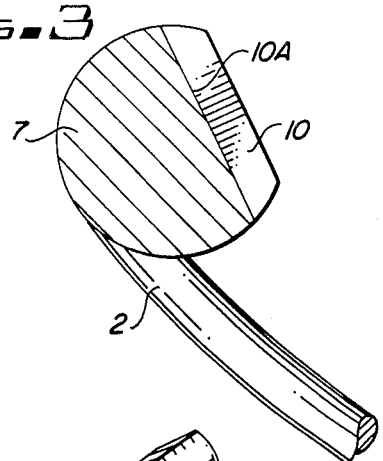
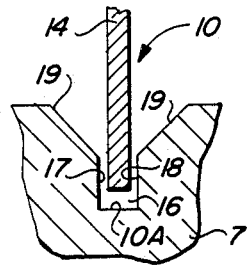
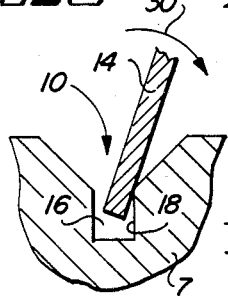
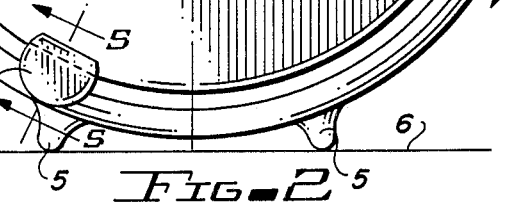
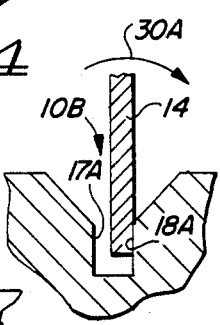
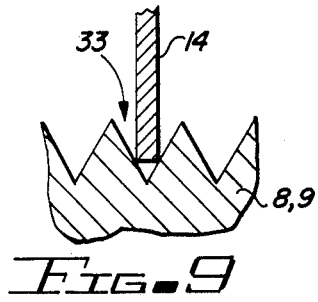
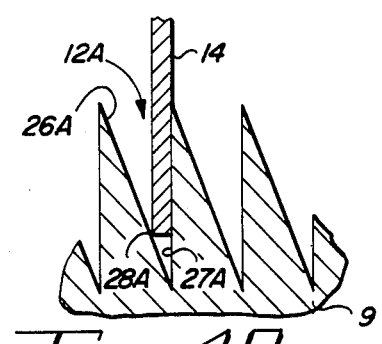

WAFER CARRIER AND METHOD

BACKGROUND OF THE INVENTION

The invention relates to high temperature wafer boats suitable for carrying a plurality of semiconductor wafers during high temperature processing thereof in diffusion tubes, and more particularly to improvements in wafer boats to avoid stressing or binding of wafers as a result of thermal expansion thereof, and still more particularly to improvements that avoid generation of silicon dust and quartz dust or the like due to "rattling" or movement between supported wafers and the wafer-supporting slots of the wafer boats.

It is well known that numerous cleaning, coating and diffusion operations are required in the fabrication of semiconductor wafers, and that often fifty-wafer quartz boats are used, wherein there is a three/thirty-seconds (3/32) of an inch center-to-center spacing between the wafers for diffusion operations, whereas for most other cleaning operations, plastic carriers are used. The plastic wafer carriers also have long vertical side grooves or wafer guides, the bottoms of which are approximately one hundred mils wide and the sides of which are tapered outwardly by approximately two degrees. The most efficient, highest yield semiconductor manufacturing facilities include expensive equipment and require extensive precautions on the part of workers to maintain the wafer fabrication environment at the highest possible level of purity. For example, expensive laminar air flow systems, and expensive dust filters often are used. The most modern facilities completely eliminate use of tweezers and manual handling of wafers in order to reduce the amount of silicon dust that is produced, and all workers wear clean gowns, hair nets, and in some cases, even face masks. However, due to build-up of static electricity on various wafer handling components, even small amounts of silicon dust can become attached to wafer surfaces or to surfaces that touch wafers. For example, silicon dust can become attached to the sides of the grooves of the above-mentioned plastic wafer carriers, and when the wafers are transferred into such carriers, the periperal portion of the active face of the wafer may slide against such silicon dust, causing defects in one or quite a few peripheral circuits on the wafer. This, of course, reduces yield and increases the overall cost per unit of the circuits being manufactured.

The prior quartz diffusion boats cause generation of silicon dust and quartz dust because the wafer-supporting grooves thereof generally have shapes and tolerances which allow the wafers to "rattle" or move in these grooves as the boat is moved during various operations. This movement or rattling results in abrasion of edges of the wafers against the bottoms of the wafer-supporting grooves, thereby causing the breaking off of minute particles of silicon and quartz, which then may adhere to surfaces of semiconductor wafers. Such abrasion also occurs for other types of wafers, such as gallium arsenide, and for other types of carriers, such as polycrystalline silicon or silicon carbide. The particulates produced by abrasion therebetween are also highly undesirable and are known to cause defects in integrated circuits.

Most prior quartz wafer boats fall into one of three categories, namely, "four member" boats, "three member" boats, and "shell" boats. All of these prior wafer boats have the problem that wafers held therein are subject to a considerable amount of "rattling" or rolling from side to side during normal "handling" of the boats, either by humans or by automated machinery, during wafer manufacturing operations. The wafer movement or "rattling" in such boats occurs because of tolerances that need to be provided in each of the slots in which the peripheral edges of the wafers rest, and produces minute particles of the wafer or the boat, for example, silicon dust and quartz dust, if the wafers are silicon and the boat is made of quartz, of course. Another problem that characterizes the above high temperature wafer boats is that when a boat load of wafers is placed in the hot zone of a furnace, its temperature is typically raised to temperatures in the range of 600° to 1250° Centigrade or greater. Silicon has a much greater coefficient of thermal expansion than any of the common materials of which wafer boats are made, namely quartz, polycrystalline silicon, and silicon carbide. The greater thermal expansion of the wafers can cause "binding" of the wafers as they expand (more with respect to temperature than the wafer boats), unless sufficient clearance is provided between the wafer edges and the bottoms of the slots in the upper members or slot-containing members. Such stresses can cause cracking of wafers, and can also cause generation of defects in the crystal lattice structure, resulting in reduced integrated circuit yields, and hence in decreased profitability.

The known "four member" boats include two bottom members that support the weight of the wafers. The bottom members are positioned symmetrically about the center of gravity of the wafers supported thereby. The two side members or upper members also are symmetrically positioned, higher up and further outward relative to the bottom members. Usually, sufficient clearance is allowed between the bottoms of the grooves in the upper members and the edges of the wafers to allow for wafer expansion. As a result, the wafers can rock back and forth between the bottoms of the slots of the side members, when the boat is moved or subjected to vibration, for example by robotic machines, generating minute particles of the wafer material and the boat material, such as quartz dust and silicon dust. The bottom members can be moved further apart to reduce the tendency of the wafers to rock to and fro in this manner, but this results in the wafers being held less perfectly vertical and parallel, which in turn leads to a reduction in the uniformity of flow of reactant gases between wafers, and a consequent reduction in yield of the individual integrated circuits being formed in the wafers. If the bottom members are positioned close together, the wafers are more unstable and more apt to rotate about their vertical axes when the boat is subjected to movement or vibration, since the areas of contact are closer together. This kind of rotation or "rattling" movement between the wafers and the carrier also causes generation of silicon and/or quartz particulates or the like. Such rotation also decreases the preciseness of the parallel relationship between wafers and adversely effects the uniformity of diffusion and/or deposition processes that form integrated circuits in the wafers. Furthermore, if the two bottom members are moved further apart to provide more stability of the supported wafers, the forces produced by binding as the wafers expand at high temperatures are much greater than if the bottom members are close together, leading to buckling, possible wafer cracking, and likely generation of defects in the silicon lattice structure at high temperatures.

The above-mentioned prior art "three member" wafer carriers have a single bottom member located directly below the center of gravity of the wafers, and two symmetrically positioned side members. Enough clearance is allowed in the bottoms of the slots of the side members in relation to the wafer diameter to accommodate wafer expansion at high temperature. In such three member wafer boats, the wafers teeter back and forth on the center member and also to rest on the "bottom" of one side member or the other. The wafers in "three member" wafer boats have an even greater tendency to roll back and forth or rattle during handling of the wafer boat than the above-described "four member" wafer carriers; however, they tend to hold the wafers more precisely vertical and parallel due to the greater distance between the bottom member and the upper side support members. In the shell-type carriers, in which a solid semicylindrical section of quartz has semicircular slots, the radius of curvature of the semicircular parallel slots must be slightly greater than the radius of the semiconductor wafers to avoid severe binding at high temperatures. Hence, the wafers rock back and forth in the slots, again generating quartz dust and silicon dust.

In a fourth type of wafer carrier, described in commonly assigned co-pending application "Semiconductor Wafer Diffusion Boat and Method", Ser. No. 544,588, filed Oct. 24, 1983, by Robert M. Butler and incorporated herein by reference, wafer grooves in adjacent members or rails are provided with oppositely sloped surfaces and opposed vertical surfaces, respectively, that maintain each wafer very precisely vertical, so that large wafers are held more precisely parallel than in any prior carrier. The two members contain the oppositely sloped wafer grooves that are positioned relatively close together to support the bottom edge of each wafer and to prevent excessive stress due to thermal expansion of the wafers.

Those skilled in the art know that numerous efforts are made to effectuate "gentle" handling of wafer boats to avoid the above-described wafer rattling. Considerable efforts are made in the field of automated wafer handling to subject wafer boats to minimum amounts of acceleration, deceleration, and vibration but nevertheless, prior wafer boats, except for the one described in co-pending application Ser. No. 544,588 mentioned above, are subject to considerable rattling within the boat or carrier, despite such precautions and efforts.

There clearly is a continuing need for further improvements in the field of providing wafer carriers that carry a plurality of semiconductor wafers in perfectly parallel, equally spaced relationship to each other, and yet avoid the above-mentioned difficulties, especially the difficulties that lead to wafer rattling and consequent generation of silicon dust, and/or quartz dust and the like and which also avoid stresses within the wafers, especially during high temperature processing operations.

SUMMARY OF THE INVENTION

Accordingly, it is an object of the invention to provide an improved wafer boat or carrier that avoids significant binding between slotted rails or members of the boat and wafers supported in the boat.

It is another object of the invention to provide an improved wafer boat that supports wafers in perfectly parallel, uniformly spaced relationship to each other, yet avoids movement of the wafers relative to the boat, or "rattling" of the wafers in the boat, despite "rough" handling of the wafer boat.

It is another object of the invention to provide an improved wafer boat that avoids "rolling" of wafers in directions parallel to their planes, even when the wafer boat is tilted.

Briefly described, and in accordance with one embodiment thereof, the invention provides an improved apparatus and method for supporting semiconductor wafers in perfectly, precisely parallel, uniformly spaced relationship to each other, including a slotted bottom rail or member that is substantially offset from the center of gravity of wafers supported in the boat and which supports most of the weight of the wafers supported by the boat, and a slotted first side rail or member on the opposite side of the center of gravity from the bottom rail having slots that support a substantially lesser part of the weight of the wafers held in the boat. An adjacent slotted second side rail or member is provided on the same side of the center of gravity as the bottom rail, and has slots with bottoms deep enough that they do not normally touch the wafer edges supported in the boat except to prevent them from rolling out of the boat if it is tilted considerably more than would be expected during normal use.

In one described embodiment of the invention, conventional slots or grooves are provided in each rail, each groove having a rectangular cross-sectional bottom portion. In another described embodiment of the invention, slots or grooves having a rectangular cross-section are provided in the second side rail, and V-shaped grooves are provided in the bottom rail and the first side rail. In another embodiment of the invention, a rectangular groove is provided in the second side rail, a V-shaped groove is provided in the bottom rail, and triangular wafer-supporting grooves having one vertical wall and one inclined wall for urging one face of the wafer against the vertical wall are provided in the first side rail. In another embodiment of the invention, the wafer receiving grooves in the second side rail have rectangular cross-sections, and wafer-supporting grooves, each having a perfectly vertical wall and a sloped wall which urges a first wafer face against the vertical walls of the grooves in both the bottom rail and the first side rail. In a variation of the foregoing embodiment of the invention, a vertical wall of each of the rectangular groove portions in the second side rail is offset from the vertical walls of the grooves in the bottom rail and the first side rail by the thickness of the wafers. In the presently preferred embodiment of the invention, triangular grooves each having a vertical wall and an inclined wall are provided in the bottom rail and the first side rail, with the vertical walls thereof contacting opposite faces of the wafers, thereby holding them precisely vertical. The edges of the wafers are centered in the rectangular grooves of the second side rail.

BRIEF DESCRIPTION OF THE DRAWINGS

FIG. 1 is a perspective view illustrating a wafer boat carrier of the present invention.

FIG. 2 is an elevational side view of the wafer boat of FIG. 1 with semiconductor wafers supported therein.

FIG. 3 is a partial section view diagram showing one of the side rails of the wafer boat of FIG. 1.

FIG. 4 is a partial section view along section line 4—4 of FIG. 2.

FIG. 5 is a partial section view along section line 5—5 of FIG. 2.

FIG. 6 is a partial section view taken along section line 6—6 of FIG. 2.

FIG. 7 is a partial section view of an alternate embodiment of the wafer grooves in the non-supporting side rail of the wafer boat of FIG. 2.

FIG. 8 is a section view diagram useful in explaining the invention.

FIG. 9 is a section view of V-shaped grooves that can be used in the rails of the wafer boat of FIG. 1.

FIG. 10 is a section diagram of an alternative groove structure that can be viewed along section line 6—6 of FIG. 2.

DESCRIPTION OF THE INVENTION

Referring now to the drawings, particularly FIGS. 1 and 2, wafer boat 1 includes 3 ribs 2, 3, and 4. The outer ribs 2 and 4 each have a pair of feet 5 attached thereto for resting on a surface 6, as indicated in FIG. 2. A bottom wafer-supporting rail 8 is attached to each of the ribs 2, 3, and 4 offset to the left of the center of gravity 35 of wafers 14. A second wafer-supporting rail, namely side rail 9, is attached to the right ends of ribs 2, 3, and 4, well to the right of center of gravity line 35 and considerably higher than bottom rail 8. A non-supporting side rail or retaining rail 7 is attached to the left ends of ribs 2, 3, and 4.

Each of the rails 7, 8, and 9 has a suitable number of wafer-receiving grooves therein. More particularly, bottom rail 8 has (for example) 50 wafer-supporting grooves 11 therein. Side rail 9 has fifty wafer-supporting grooves 12 therein. Retaining rail 7 has fifty grooves 10 therein which accommodate fifty wafers to be supported by boat 1, but the grooves 10 do not ordinarily support any weight of the wafers unless the boat is accidentally tipped enough to cause the wafers to roll to the left over bottom rail 8. The grooves 10 also can help keep the wafers 14 parallel in certain instances, described later.

Referring to FIG. 2, dotted line 36 indicates an inclined line between the center of rail 8 and the center of a semiconductor wafer 14 supported by boat 1. As mentioned above, dotted vertical line 35 indicates the center of gravity of the wafers 14. Inclined dotted line 38 indicates the line between the center of wafer 14 and the center of side rail 9. In the boats I have constructed in accordance with the invention, the angle 37 by which the bottom rail 8 is offset from the center of gravity line 35 is about 15 degrees. The angle 39 by which the side rails 9 and 7 are offset from center of gravity line 35 is about 45 degrees in the described embodiment, but may be in the range from 40 degrees to 90 degrees.

In a presently preferred embodiment of the invention, the non-supporting rail 7 includes "rectangular" grooves such as 10 shown in FIG. 4, which have a rectangular portion 16 having a bottom surface 10A and vertical side walls 17 and 18. At the mouth of groove 10, sloped walls 19, having an angle of roughly 45 degrees, are provided to facilitate loading of wafers 14 into boat 1. For 150 millimeter wafers, a minimum clearance of 10 to 20 mils is provided between the bottom surface 10A and the edge of the wafer 14. The needed clearance is very dependent on the temperature to which the wafers will be raised while in the boat. Typically, a clearance of approximately 3 or 4 mils is provided between the vertical walls 17 and 18 of rectangular groove 10 and the opposed adjacent faces of the wafer 14. The clearance between the edge of wafer 14 and the bottom surface 10A of the groove 10 must be adequate to allow for greater thermal expansion of silicon wafer 14 relative to the thermal expansion of quartz, so that surface 10A does not touch the edge of wafer 14 even at the highest temperatures to which the wafer will be exposed, which temperature may be as high as 1250° Centigrade. The reason for the gaps between the faces of the wafer 14 and the vertical walls 17 and 18 of groove 10 is to provide means for limiting deviations of the wafers from their preferred orientations due to misalignment of grooves in bottom rail 8 and upper rail 9.

FIG. 5 illustrates a cross-sectional view taken along section line 5—5 of FIG. 2 of a wafer-supporting groove 11 in bottom rail 8. Wafer-supporting groove 11 has a perfectly vertical wall 22 and a sloped wall 21. The angle between sloped wall 21 and vertical wall 22 can be preferably in the range from 15 degrees to 35 degrees. The depth of groove 11 can be about 120 mils. The depth of the rectangular portion 16 of groove 10 is about 120 mils in the described embodiment, but can be from about 70 to 200 mils. As shown in FIG. 5, the sloped wall 21 of each of the wafer-supporting grooves 11 causes the edge 23 of the wafer 14 supported in that groove to be urged toward vertical wall 22. When the flat left surface of wafer 14 is pressed against vertical wall 22, tilting of the wafer 14 in the direction of arrow 24 is prevented.

The wafer-supporting grooves in rail 9 can be as shown in FIG. 6, or reversed therefrom, as shown in FIG. 10. In FIG. 6, groove 12 has a vertical wall 27 that engages the same flat left surface of wafer 14 as the vertical wall 22 of wafer-supporting groove 11 of bottom rail 8. The left face of wafer 14 is urged toward vertical wall 27 of groove 12 by the horizontal force exerted on edge 28 of wafer 14 as it tends to slide down the sloped surface 26 of groove 12. Tilting of the wafer in the direction 25 therefore is resisted by wall 27. (Somewhat surprisingly, this arrangement keeps the wafers very precisely vertical and parallel, despite the absence of a vertical wall contacting the right face of the wafers 14. This occurs because if wafers 14 were to tilt in the direction opposite to arrows 24 and 25 in FIGS. 5 and 6, the lower left-hand edge has to move through an arcuate path, pivoting on the point 23, tending to either force point 23 into the sloped surface 21, or forcing it to move "uphill" on surface 21.)

The vertical walls 22 and 27 of wafer-supporting grooves 11 and 12, respectively, are perfectly aligned in the same plane to effectuate perfectly vertical a particular wafer 14. The center of groove 10 in non-supporting side rail 7, as shown in FIG. 4, is, within reasonable manufacturing tolerances, aligned with the center plane of wafer 14. We have found that this arrangement results in the wafers 14 being very precisely held in vertical, parallel, equally spaced relationship to each other. For normal handling, there is essentially no rattling of the wafers 14, because each of the wafers 14 is snugly seated in the wafer-supporting grooves of 11 and 12 for that wafer. There is ordinarily no tendency for the wafers 14 to roll back and forth in the directions indicated by arrows 40, as is the case in most of the above-described prior art wafer boats, during normal handling.

If, for some reason, the wafer boat is subjected to tilting, acceleration, or deceleration which would tend to cause one or more of the wafers 14 to move in the direction opposite to arrows 24 and 25 in FIGS. 5 and 6, i.e., in the direction of arrow 30 of FIG. 8 (which shows a displacement of the wafer 14 in a greatly exaggerated manner) the edge of the wafer will depart from its middle position as shown in FIG. 4 and touch the vertical wall 18, which prevents further tilting, and prevents the wafer from being displaced further.

If it is desired to provide greater resistance to possible tilting of the wafer 14 in the direction 30 indicated in FIG. 8, the groove 10 shown in FIG. 4 can be displaced to the left slightly, to provide the groove indicated by reference numeral 10B in FIG. 7, wherein the vertical wall 18A is offset from the plane of vertical walls 23 and 27 of grooves 11 and 12 by the thickness of wafer 14. Wall 18A therefore touches the right-hand face of wafer 14, thereby resisting tilting of wafer 14 in the direction of arrow 30A, while the vertical walls 22 and 27 in FIGS. 5 and 6 resist tilting in the direction of arrows 24 and 25. However, more precise tolerances will be required in the manufacturing of the grooves 10B than will be required for the grooves 10 shown in FIG. 4.

A presently preferred embodiment of the invention has the structure described above, except that the steeply inclined slopes of the wafer-supporting grooves in rail 9 are sloped in the opposite direction to those in bottom rail 8, so that the opposite faces of the wafer 14 are both urged against perfectly vertical walls of the separate grooves, and therefore are held almost perfectly vertically and rattling of the wafers is almost entirely avoided during normal handling of the wafer boat.

More specifically, in the presently preferred embodiment of the invention, the configuration of the wafer-supporting grooves in rail 9 is as illustrated in FIG. 10, rather than in FIG. 6. As shown in FIG. 6 the wafer-supporting grooves 12A in rail 9 include perfectly vertical walls 27A intersected by steeply inclined walls 26A. The slope of inclined wall 26A of FIG. 10 is opposite to the slope of inclined wall 26 of FIG. 6. The lower edge of the left face of wafer 14 in FIG. 10 contacts inclined wall 26A. The weight of wafer 14 on point 28A produces a force that presses the right face of wafer 14 against vertical groove wall 27A. Since the weight of wafer 14 also causes the lower edge of the right face of wafer 14 to rest on point 23 of inclined groove wall 21 in groove 11 of bottom rail as shown in FIG. 5 (thereby also pressing the left face of wafer 14 against vertical groove wall 22 in FIG. 5) all faces of all wafers supported in the preferred embodiment of the wafer boat of the present invention are continually pressed against nearly perfectly vertical groove walls. Rattling or movement of wafers relative to the wafer boat is almost entirely avoided, and very precise, parallel, uniform spacing of all of the supported wafers is achieved. Uniform reactant gas flows between wafers is thereby achieved, and high yields of the integrated circuits formed on the wafers can be achieved, both because of the uniform reactant gas flow that can be achieved between supported wafers and because of the absence of defect-causing silicon and/or quartz particulates that would otherwise be generated by rattling of the supported wafers.

The wafer boat as described with reference to FIGS. 1 and 2 need not have the vertical wall/sloped wall configurations shown in FIGS. 5 and 6 for the bottom groove 8 and side groove 9 in order to obtain many of the benefits of the basic three rail, non-symmetrical structure. For example, both wafer-supporting bottom rail 8 and wafer-supporting side rail 9 may have rectangular grooves such as groove 10 shown in FIG. 4. To a large extent, rattling of the wafers will be avoided by virtue of the off-center location of bottom rail 10, that prevents side-to-side rocking of wafers 14 in the direction of arrows 40 in FIG. 2. Another configuration that works well is the provision of V-grooves such as 33 in FIG. 9 in both bottom rail 8 and side rail 9. Ordinarily, the grooves in non-supporting rail 7 in most embodiments of the invention will have the general rectangular structure shown in FIG. 4 or FIG. 7. Another acceptable arrangement of groove structures would be to provide a V-shaped groove in bottom rail 8 and a groove with one vertical surface and one inclined surface (i.e., a groove 12 as shown in FIG. 6) in weight-supporting side rail 9, or vice versa.

All of the above-described embodiments of the invention have a number of important advantages, a primary advangage being that movement or rattling of wafers and resultant abrasion during normal handling of the wafer boats, either by humans or by automatic machinery, is minimized by the fact that the bottom rail supports most of the weight. This allows the edge of the wafer to "roll" slightly along the supporting surfaces of the wafer grooves in side rail 9 as the wafer expands more than the quartz boat as the temperature is increased to levels as high as 1250° Centigrade. By supporting most of the weight of the wafers on the bottom rail 8, a greater distance along the wafers can be provided between the bottom rail 8 and the wafer-supporting upper rail 9 without resulting in binding of the wafers due to their thermal expansion. Such wider separation between bottom rail 8 and upper rail 9 results in greater stability of the supported wafers and more precise parallel relationship therebetween. Excessive internal stresses in the wafer are therefore avoided. The resulting defects in the crystal lattice are consequently avoided. The generation of silicon dust and quartz dust that accompanies rattling of wafers in prior wafer boats is almost completely avoided. When the vertical/sloped wall grooves shown in FIG. 5 and 6 are used, an extremely precisely vertical, parallel relationship between adjacent wafers is achieved. Another advantage is that the useful life of the wafer boats having V-shaped and/or triangular grooves is extended because periodic etching of the wafer boats to clean them does not decrease the accuracy with which the wafers are supported, whereas in boats with only rectangular grooves, each such etching process widens the rectangular grooves and reduces the uniformity of the wafer spacings and parallelness. In instances in which etching of wafers is performed in quartz carriers, the minimal contact between the groove walls and the faces of the wafers in which integrated circuits are formed is advantageous.

While the invention has been described with reference to several particular embodiments thereof, those skilled in the art will be able to make various modifications to the described embodiments without departing from the true spirit and scope of the invention. It is intended that all variations of the invention wherein the elements and/or steps are equivalent to those in the described embodiments, in that they perform substantially the same work in substantially the same way to accomplish substantially the same function, are to be considered to be within the ambit of the invention. For example, the retaining rail 7 can be entirely omitted in cases wherein the danger of an operator tilting the wafer boat enough to cause the wafers to roll out can be avoided. In another variation, the grooves 10 in the retaining rail 7 can be eliminated, although the retaining rail itself is used. And, of course, higher profile structures than the one shown can be provided, wherein the retaining rail 7 and side rail 9 are supported in higher positions relative to bottom rail 8 than shown in FIGS. 1 and 2. The angles 37 and 39 indicated in FIG. 2 can be varied considerably from the values indicated above. The wafer boat can be tilted about its longitudinal axis while it is being moved to cause the wafers to lean against the walls of the supporting grooves to further reduce their tendency to rattle. The groove walls referred to herein as vertical walls need not actually be precisely vertical, and may be slightly sloped to encourage the wafers to lean against the slightly sloped walls to reduce the rattling of the wafers. In certain instances, it may be desirable to make the wafer boat of plastic, such as teflon or polypropylene. (Abrasion and particle generation can also occur even when the boats are composed of such plastics, and the structures of the invention can reduce the amount of particle generation.)

I claim:

1. A wafer carrier for carrying round semiconductor wafers comprising:
   (a) a first member having a plurality of wafer-supporting grooves therein;
   (b) a second member having a plurality of wafer-supporting grooves therein aligned, respectively, with the wafer-supporting grooves of the first member, the wafer-supporting grooves of the first and second members being oriented to carry the wafers in closely spaced, precisely parallel relationship to each other; and
   (c) means for supporting the first and second members in spaced relationship to each other and in nonsymmetrical relationship to a vertical plane passing through the centers of gravity of wafers supported by the first and second members;
   wherein the first member is offset a first distance to a first side of the vertical plane passing through the centers of gravity and supports a major portion of the weight of wafers supported by the wafer carrier, wherein the second member is offset a second distance to an opposite side of the vertical plane passing through the centers of gravity and supports the remaining minor portion of the weight of the wafers supported by the wafer carrier, the second distance being substantially greater than the first distance, the second member being substantially elevated relative to the first member, both the first distance and the second distance being substantially less than the radius of the wafers, there being no other member between the first and second members supporting weight of the wafers.

2. The wafer carrier of claim 1 including means for retaining wafers in the wafer carrier by preventing the wafers from rolling over the first member.

3. The wafer carrier of claim 2 wherein the retaining means include a third member and means for supporting the third member in spaced relationship to the first member outwardly of and elevated relative to the first member.

4. The wafer carrier of claim 3 wherein the wafer-supporting grooves of the first and second members are rectangular grooves and the third member includes a plurality of rectangular grooves that prevent sideways displacement of the wafers to their planes but do not support weight of the wafers.

5. The wafer carrier of claim 3 wherein the third member is located so that it does not touch the wafers supported by the wafer carrier, even when they are elevated to a predetermined temperature, except when the wafers are caused to be displaced sideways in their respective planes a predetermined distance away from the second member toward the third member.

6. The wafer carrier of claim 3 wherein the third member includes a plurality of wafer-receiving grooves that are respectively aligned with the wafer-supporting grooves of the first and second members.

7. The wafer carrier of claim 6 wherein a first wafer-supporting groove of one of the first and second members includes a vertical wall for engaging a first flat surface of a first wafer and a steeply inclined wall for engaging and supporting a lower edge of a second flat surface of the first wafer to urge the first flat surface of the first wafer against the vertical wall of that wafer-supporting groove to hold the first wafer in a precisely vertical orientation.

8. The wafer carrier of claim 7 wherein a first wafer-supporting groove of the second member is essentially identical to the first wafer-supporting groove of the first member.

9. The wafer carrier of claim 8 wherein a first wafer-receiving groove of the third member is a rectangular groove having a first vertical wall aligned with and for engaging the second flat surface of the first wafer when its first flat surface is pressed against the vertical wall of the first wafer-supporting groove of the first member or the second member.

10. The wafer carrier of claim 7 wherein a first wafer-supporting groove of the other of the first and second members includes a vertical wall for engaging the second flat surface of the first wafer and a steeply inclined wall for engaging and supporting the lower edge of the first flat surface of the wafer to urge the second flat surface of the first wafer against the vertical wall of the first wafer-supporting groove of the second member to help hold the first wafer in a precisely vertical orientation.

11. The wafer carrier of claim 10 wherein the wafer-receiving grooves of the third member are rectangular grooves, and wherein the width of the rectangular grooves is greater than the thickness of the first wafer by a predetermined amount selected to maintain the first wafer in a plane extending through the first wafer-supporting grooves of the first and second members and the first wafer-receiving groove of the third member.

12. The wafer carrier of claim 1 composed of one of the materials selected from the group consisting of quartz, polycrystalline silicon, plastic, and silicon carbide.

13. The wafer carrier of claim 1 wherein the wafer-supporting grooves of one of the first and second members are V-shaped.

14. The wafer carrier of claim 1 including means for urging a flat surface of each of the supported wafers toward a vertical wall of a groove supporting that wafer to reduce rattling of the wafer.

15. A method of carrying round semiconductor wafers, comprising the steps of:

(a) providing a first member having therein a plurality of wafer-supporting grooves;
(b) supporting lower edge portions of the wafers in those grooves, respectively, at points offset a first distance in a first direction from a vertical plane passing through the centers of gravity of the supported wafers;
(c) providing a second member having therein a plurality of wafer-supporting grooves; and
(d) supporting lower edge portions of the wafers at points that are offset a second distance in a direction opposite to the first direction from the vertical plane passing through the centers of gravity of the supported wafers, so that the first member supports a major portion of the weight of the supported wafers and the second member supports the remaining minor portion of the weight of the supported wafers, the second distance being substantially greater than the first distance, the first and second distances both being substantially less than the radius of the wafers, no portions of the wafers between the first and second members being supported by any other member.

16. The method of claim 15 including providing a third member located outwardly from and upwardly from and in fixed relationship to the first member for retaining the supported wafers in a wafer carrier including the first, second, and third members by engaging the edges of the supported wafers if they roll in their respective plans on the first member toward the third member.

17. The method of claim 16 including providing wafer-receiving grooves into which the edges of the supported wafers partly extend to limit tilting of the supported wafers transverse to the planes thereof.

* * * * *